(12) United States Patent
Lin et al.

(10) Patent No.: US 6,217,348 B1
(45) Date of Patent: Apr. 17, 2001

(54) ELECTRICAL CONNECTOR

(75) Inventors: Nick Lin, Hsin Chuang; Chieh-Rung Huang, Tao-Yuan, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/369,665

(22) Filed: Aug. 9, 1999

(51) Int. Cl.[7] ................................................. H05K 1/00
(52) U.S. Cl. ........................................ 439/83; 257/738
(58) Field of Search ........................... 439/83, 876, 875, 439/78, 76.1, 682; 361/777; 174/260, 261; 257/738

(56) References Cited

U.S. PATENT DOCUMENTS

| | | | |
|---|---|---|---|
| 4,502,745 | * | 3/1985 | Chavers et al. ................. 439/83 |
| 4,537,461 | * | 8/1985 | Ouelette ........................ 439/83 |
| 4,679,889 | * | 7/1987 | Sheider ......................... 439/876 |
| 5,706,178 | * | 1/1998 | Barrow ......................... 361/777 |
| 6,024,584 | * | 2/2000 | Lemke et al. ................... 439/83 |
| 6,056,558 | * | 5/2000 | Lin et al. ...................... 439/83 |

* cited by examiner

*Primary Examiner*—Neil Abrams
*Assistant Examiner*—J. F. Duverne
(74) *Attorney, Agent, or Firm*—Wei Te Chung

(57) ABSTRACT

An electrical connector (4) electrically connects a CPU (6) to a motherboard (3) and comprises a housing (40) and a plurality of contacts (5). The housing has a first face (41) for engaging the CPU, a second face (42) for attaching to the motherboard and a plurality of contact passageways (43) defined between the two faces for receiving the contacts. Each contact comprises a contact section (51) which extends beyond the first face and engages a corresponding contact of the CPU, a tail (52) received in the contact passageway, and a receiving section (53) opposite the contact section which abuts a mating face (44) of the passageway proximate to the second surface to form an arcuate receiving surface for engaging a solder ball (2). After the solder ball is heated, the tail is electrically engaged to a contact on the motherboard. Due to the configuration of the arcuate receiving space, the solder ball remains in its original position and the contact is prevented from inclining.

8 Claims, 5 Drawing Sheets

ELECTRICAL CONNECTOR

BACKGROUND OF THE INVENTION

The present invention relates to an electrical connector, and more particularly to an electrical connector for facilitating connection of a CPU to a circuit board.

With the increase of input/output tails and the higher density of these tails, simplified methods of connecting the CPU to a motherboard are required. U.S. Pat. No. 5,706,178 discloses a ball grid array integrated circuit package which has a plurality of elliptical solder pads located on a bottom surface of a package substrate thereof. As shown in FIG. 1, an electrical connector 1 comprises a housing 10 having a bottom face 11 and a contact 12 extending through a contact passageway defined in the housing 10. A solder ball 2 is attached to a tail 13 of the contact 12. After the electrical connector 1 is placed on a motherboard 3, the solder balls 2 are heated to a melting point and then solidify to electrically connect the connector 1 to the motherboard 3. When the solder ball 2 is attached to the tail 13 of the contact 12, the bottom face 11 may contact and deform the solder ball 2. Thus, solder balls of different shapes are the result, leading to various speeds of melting and solidifying thereby causing the electrical connector 1 to incline and complicating the process of connecting the contacts 12 to the mother board 3. Furthermore, since the deformed solder balls 2 may contact tails of the motherboard during melting, the circuit board may become short-circuited.

BRIEF SUMMARY OF THE INVENTION

A main object of the present invention is to provide an electrical connector having solder balls attached to contacts thereof whereby the engaging area between each solder ball and the corresponding contact is large enough to assume reliable positioning of the solder during its melting, thereby promoting reliable electrical transmission between the connector and the motherboard.

A second object of the present invention is to provide an electrical connector having contacts, each contact forming a space for receiving and fixedly positioning a solder ball.

A third object of the present invention is to provide an electrical connector having solder balls attached thereto, each solder ball being able to maintain its shape thereby preventing the electrical connector from inclining.

The electrical connector of the present invention comprises a housing and a plurality of contacts. The housing has a first face for engaging a CPU and a second face for attaching to a motherboard. A plurality of contact passageways is defined between the two faces for receiving the contacts. Each contact comprises a contact section and a tail. The contact section extends beyond the first face and engages a corresponding contact of the CPU. The tail of the contact is received in the corresponding passageway and forms a receiving section at a free end thereof extending to the second face of the housing. The receiving section of each contact and a mating face of the corresponding passageway form a receiving surface for receiving a solder ball. The receiving surface has a shape corresponding to the solder ball to improve the soldering effect between the solder ball and the contact, increase the engaging area thereof, and maintain the shape of the solder ball to prevent the connector from inclining.

Other objects, advantages and novel features of the invention will become more apparent from the following detailed description when taken in conjunction with the accompanying drawings.

DETAILED DESCRIPTION OF THE INVENTION

Figure 1:
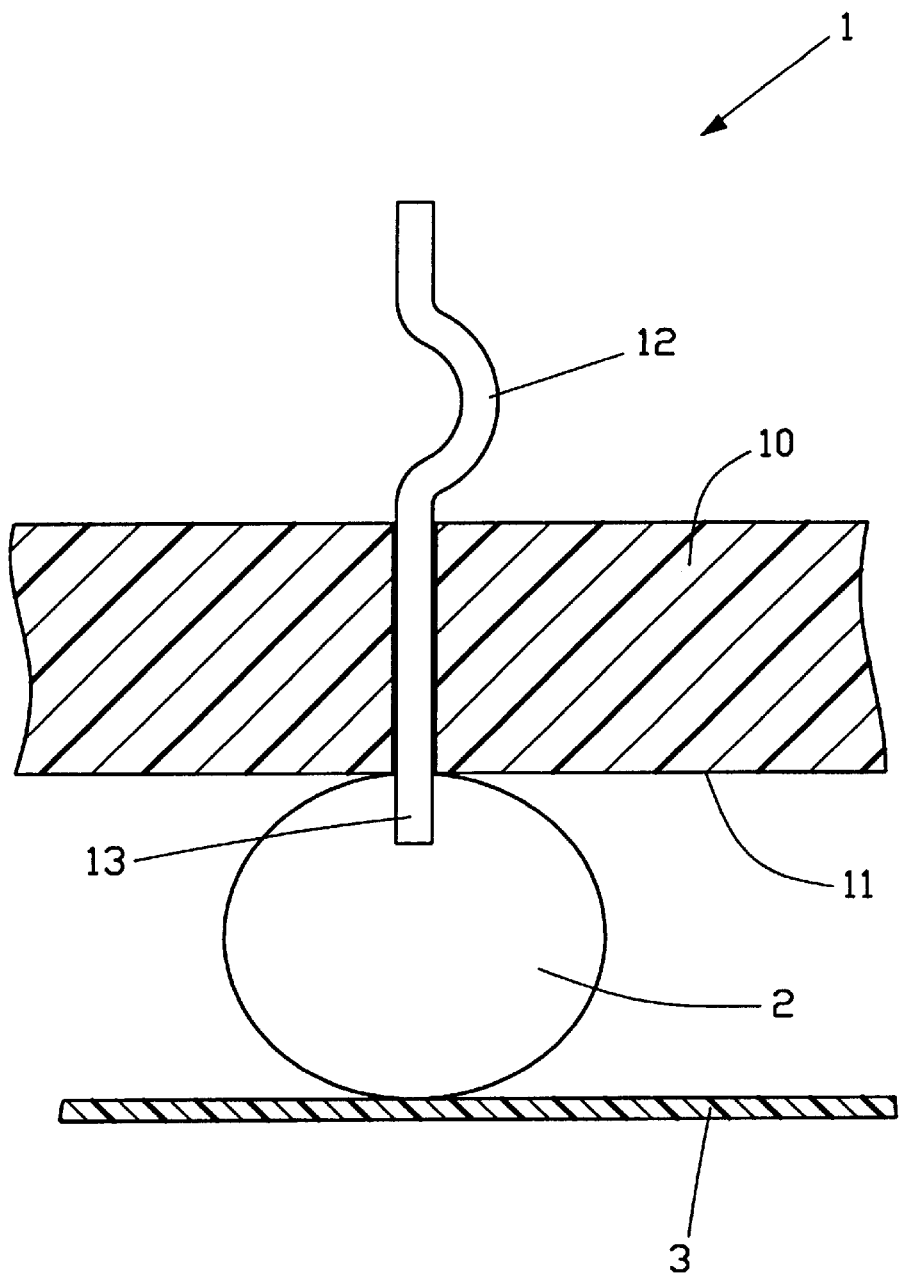
FIG. 1 is a sectional view of a solder ball attached to a contact of a conventional electrical connector.
Figure 2:
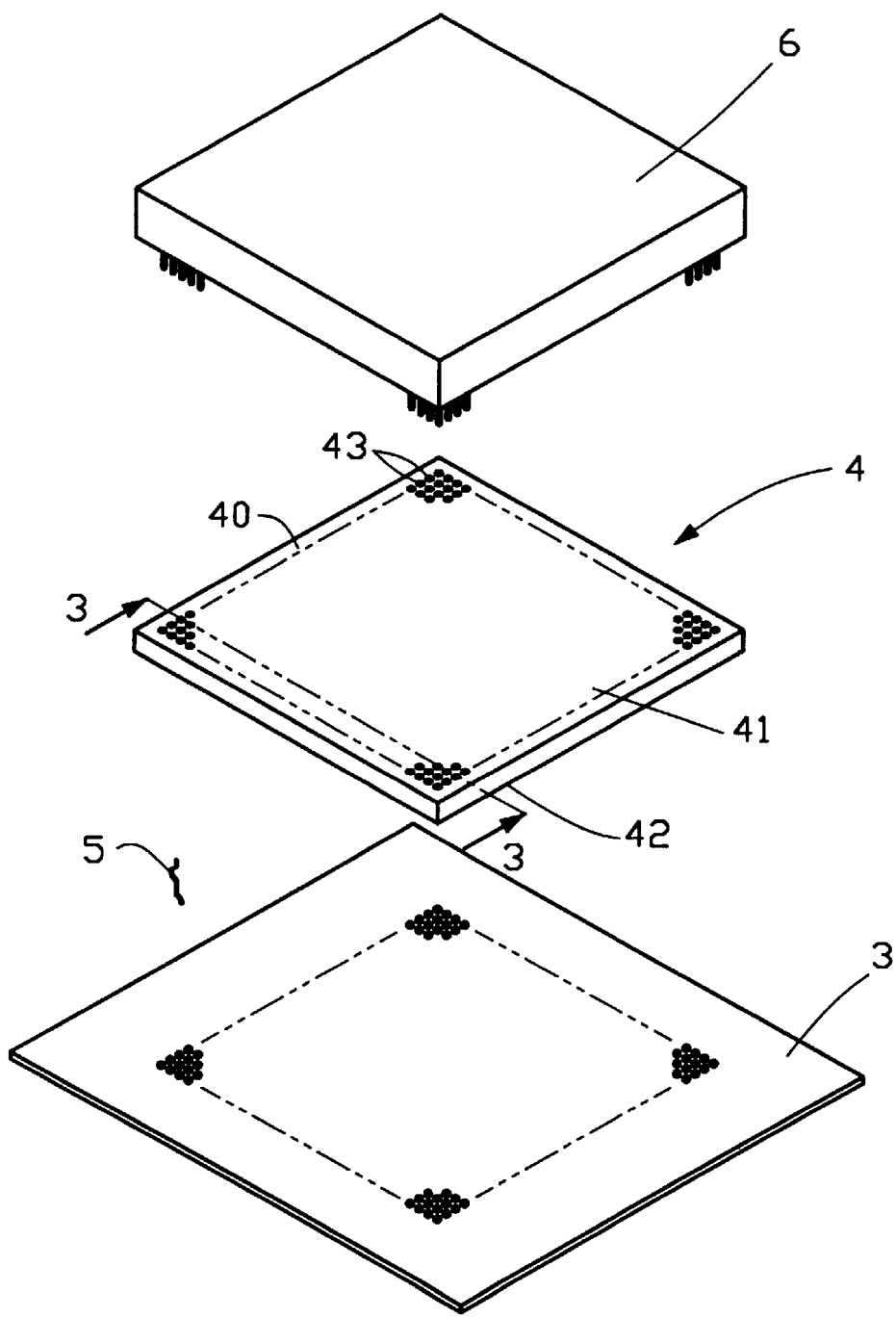
FIG. 2 is an exploded view of an electrical connector assembly in accordance with the present invention.

Referring to FIG. 2, an electrical connector assembly in accordance with a first embodiment of the present invention includes an electrical connector 4, CPU 6, and motherboard 3. The electrical connector 4 comprises a housing 40 having a first face 41, a second face 42 opposite the first face 41, and a plurality of contacts 5. The CPU 6 is attached to the first face 41 and the second face 42 is connected to the motherboard 3. A plurality of contact passageways 43 is defined between the first face 41 and the second face 42 for receiving the contacts 5 therein.

Figure 3:
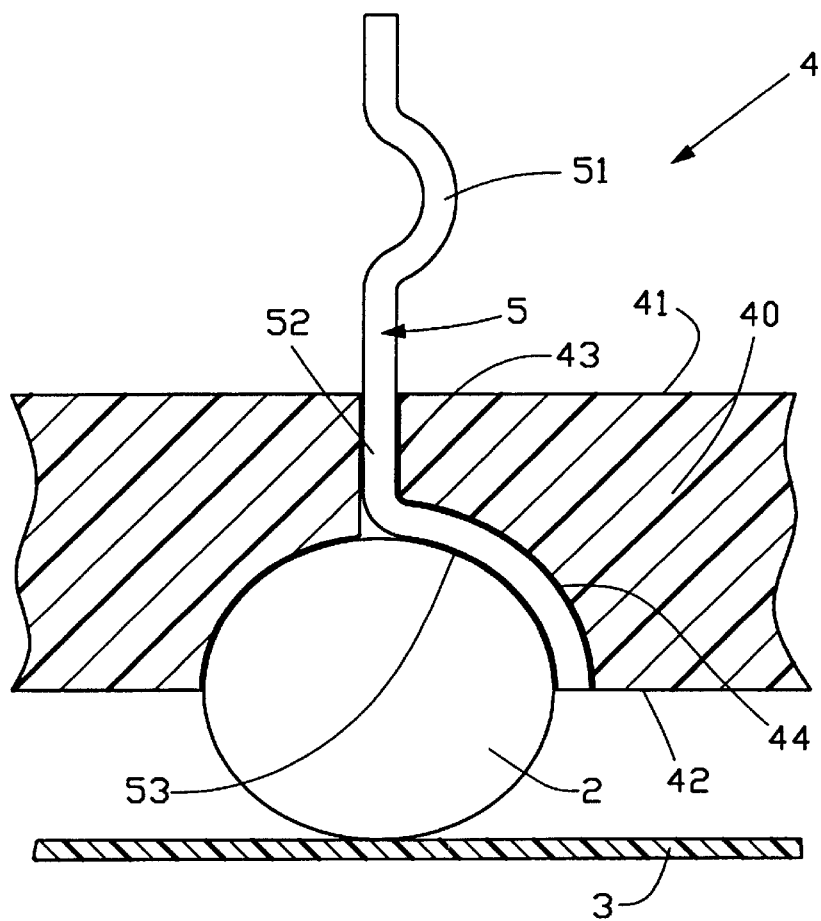
FIG. 3 is a cross-sectional view of FIG. 2 taken along line 3—3.

As shown in FIG. 3, an arcuate mating face 44 is formed in each contact passageway 43. Each contact 5 is received in the corresponding passageway 43 of the housing 40 and includes a contacting section 51, a tail 52, and an arcuate receiving section 53. The contact section 51 of the contact 5 extends beyond the first face 41 of the housing 40 to engage a corresponding contact (not shown) of the CPU 6. The tail 52 of the contact 5 is received in the corresponding passageway 43 of the housing 40. The receiving section 53 extends from the tail 52 and abuts against the mating face 44 of the passageway 43 to form an arcuate or one-fourth spherical receiving surface (not labeled) for engaging a solder ball 2. After the solder ball 2 is heated, the to tail 52 is electrically engaged with a corresponding contact (not shown) of the motherboard 3. Due to the configuration of the arcuate receiving space, the solder ball 2 maintains its original position after melting thereby increasing the soldering effect and area, and ensuring proper electrical contact between the electrical connector 4 and the mother board 3. The arcuate receiving space prevents the solder ball 2 from deforming after connecting to the mother board. Thus, the connector 4 will not become inclined and will remain properly engaged with the mother board 3.

Figure 4:
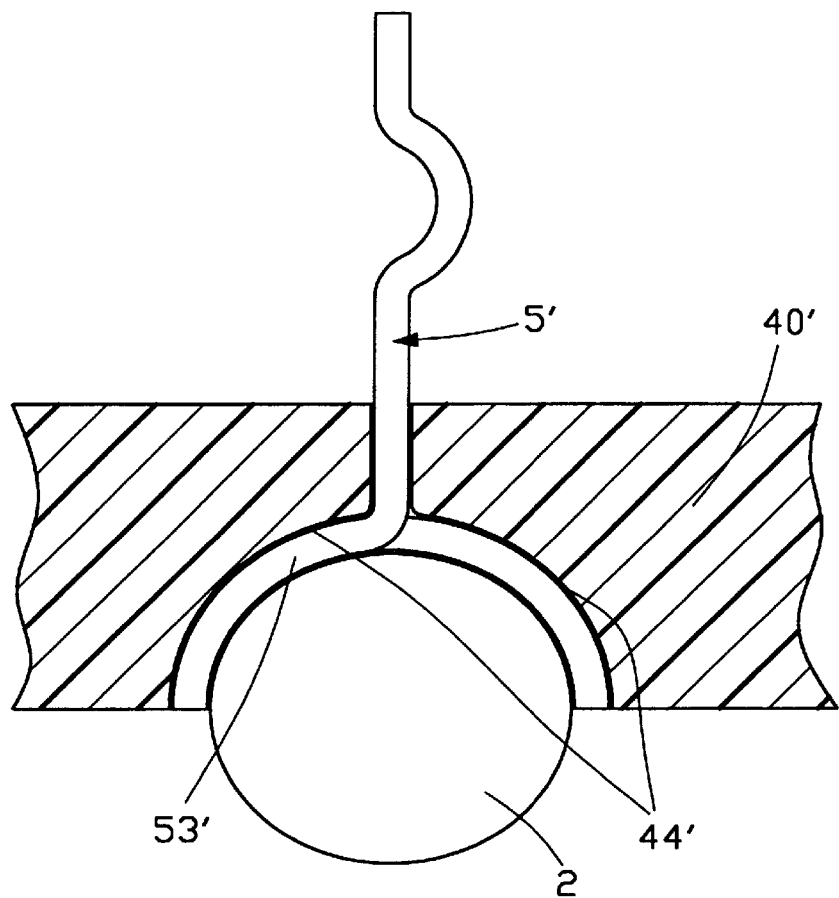
FIG. 4 is a cross-sectional view of a second embodiment of the present invention.

FIG. 4 shows a second embodiment of the present invention. Each contact 5' of the electrical connector 4 has a semicircular receiving section 53'. The receiving face 53' has two arcuate branches for receiving the solder ball 2. The housing 40' has a mating face 44' configured to matingly engage the receiving face 53' of the contact 5'.

Figure 5:
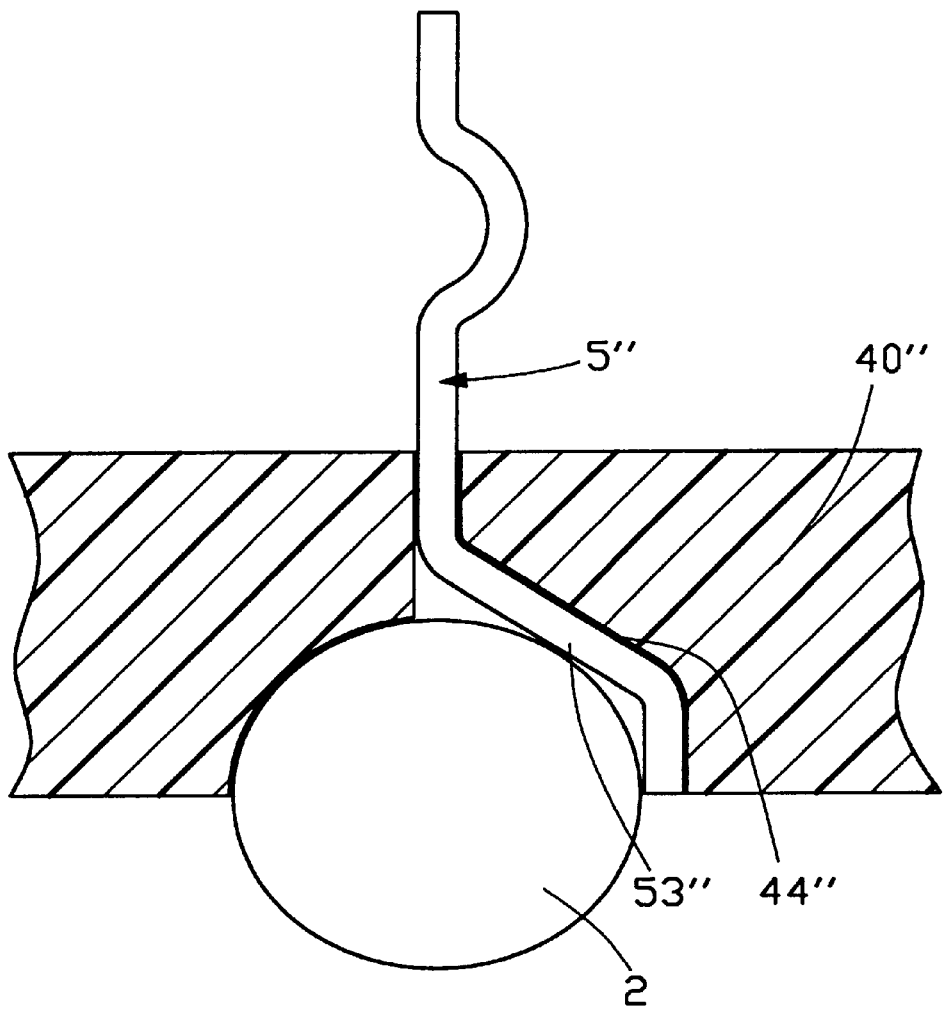
FIG. 5 is a cross-sectional view of a third embodiment of the present invention.

FIG. 5 shows a third embodiment of the present invention. Each contact 5" has a slanted receiving section 53" for engaging a mating face 44" of a housing 40" to form a receiving surface for engaging the solder ball 2.

The different receiving sections of the contacts maintain the contact and the solder ball and ensure a dependable soldering effect. Thus, the connection between the electrical connector and the mother board is consistently correct.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting a CPU to a mother board, comprising:

a housing comprising a first surface for attaching to the CPU, a second surface opposite the first surface for connecting with the mother board, a plurality of contact passageways defined between the first surface and the second surface, each contact passageway forming a mating face; and a plurality of contacts received in the contact passageways, each contact comprising a contact section for contacting the CPU and a tail, each tail forming a receiving section at a free end thereof, the receiving section engaging with the mating face of the contact passageway to form a receiving surface for receiving a solder ball, the solder ball connecting the receiving section of the contact to the mother board by soldering.

2. The electrical connector as claimed in claim 1, wherein each receiving section of the contact is arcuate.

3. The electrical connector as claimed in claim 2, wherein each mating face of the passageway is arcuate for engaging the arcuate receiving section of corresponding contact.

4. The electrical connector as claimed in claim 1, wherein each receiving section of the contact is semicircular for receiving the solder ball.

5. The electrical connector as claimed as in claim 4, wherein the mating face of each passageway forms a hemispherical space for engaging the receiving section of corresponding contact.

6. The electrical connector as claimed in claim 1, wherein each receiving section of the contact forms an inclined face.

7. The electrical connector as claimed in claim 6, wherein the mating face of each passageway is inclined for engaging the receiving section of corresponding contact.

8. An electrical connector for connecting a CPU to a mother board, comprising:

a housing defining a first surface for engagement with the CPU, a second surface opposite to the first surface for connecting with the mother board, a plurality of contact passageways defined between the first surface and the second surface, each of said contact passageways forming an arcuate mating face around the second surface;

a plurality of contacts received within the contact passageways, respectively, each of said contacts comprising a contact section for contacting the CPU and a tail for contacting the mother board through a solder ball, each tail forming an arcuate receiving section at a free end thereof, said receiving section compliantly abutting against the mating face and providing an arcuate receiving surface on an underside thereof for compliantly receiving the solder ball therein.

* * * * *